United States Patent
Dawson et al.

(10) Patent No.: US 9,990,447 B2
(45) Date of Patent: Jun. 5, 2018

(54) DEVICE ARRAY LOCKS AND KEYS

(71) Applicant: International Business Machines Corporation, Armonk, NY (US)

(72) Inventors: Alan B. Dawson, Eastleigh (GB); Gordon D. Hutchison, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 533 days.

(21) Appl. No.: 14/623,866

(22) Filed: Feb. 17, 2015

(65) Prior Publication Data

US 2015/0258737 A1    Sep. 17, 2015

(30) Foreign Application Priority Data

Mar. 17, 2014    (GB) .................................. 1404763.3

(51) Int. Cl.
| | |
|---|---|
| *G08C 19/00* | (2006.01) |
| *G06F 17/50* | (2006.01) |
| *G05B 15/02* | (2006.01) |
| *G07C 9/00* | (2006.01) |
| *E05B 19/26* | (2006.01) |
| *E05B 17/00* | (2006.01) |
| *E05B 15/16* | (2006.01) |

(52) U.S. Cl.
CPC .......... *G06F 17/50* (2013.01); *E05B 17/0004* (2013.01); *E05B 19/26* (2013.01); *G05B 15/02* (2013.01); *G07C 9/00896* (2013.01); *E05B 2015/1642* (2013.01); *G07C 2009/00936* (2013.01)

(58) Field of Classification Search
CPC ..... G06F 17/50; G05B 15/02; G07C 9/00896; G07C 2009/00936; G07C 9/1642; E05B 2015/1642; E05B 17/0004; E05B 19/26

USPC ........................................................ 340/5.51
See application file for complete search history.

(56) References Cited

U.S. PATENT DOCUMENTS

| | | | |
|---|---|---|---|
| 3,496,636 A | 2/1970 | Lieptz | |
| 3,836,945 A * | 9/1974 | Kinoshita | ............... G07F 17/12 439/533 |
| 4,627,252 A | 12/1986 | Lo | |

(Continued)

FOREIGN PATENT DOCUMENTS

CN           103366431 A       10/2013

OTHER PUBLICATIONS

Intellectual Property Office, Application No. GB1409148.2, Patents Acts 1977, Examination Opinion, dated Nov. 25, 2014.

(Continued)

*Primary Examiner* — Naomi J Small
(74) *Attorney, Agent, or Firm* — Noah A. Sharkan; David B. Woycechowsky

(57) ABSTRACT

This invention relates to a system, method, and computer program product for managing a plurality of devices with associated lock mechanisms. According to one embodiment, a method is provided comprising: detecting, by one or more computer processors, a status of a device corresponding to a lock mechanism; recommending, by one or more computer processors, a service action on the device requiring performance by an operator; and providing, by one or more computer processors, a printable key pattern for printing a key that allows the operator to lock and unlock the lock mechanism in order to perform the service action.

3 Claims, 7 Drawing Sheets

(56) References Cited

U.S. PATENT DOCUMENTS

| | | | |
|---|---|---|---|
| 4,811,012 A * | 3/1989 | Rollins | G07C 9/00103 |
| | | | 235/382.5 |
| 5,103,661 A | 4/1992 | Fann et al. | |
| 5,271,698 A | 12/1993 | Heredia et al. | |
| 5,676,504 A | 10/1997 | Mueller et al. | |
| 6,906,918 B2 | 6/2005 | Rabinovitz | |
| 6,925,843 B1 * | 8/2005 | Pols Sandhu | E05B 65/46 |
| | | | 361/726 |
| 7,400,510 B1 | 7/2008 | Milligan et al. | |
| 7,481,087 B2 | 1/2009 | De Vries | |
| 2002/0022901 A1 | 2/2002 | Wetterlin et al. | |
| 2003/0046553 A1 * | 3/2003 | Angelo | G06F 21/32 |
| | | | 713/186 |
| 2005/0190037 A1 * | 9/2005 | Shitan | E05B 49/00 |
| | | | 340/5.5 |
| 2008/0053167 A1 | 3/2008 | Basche | |
| 2008/0217352 A1 * | 9/2008 | Frich | A47F 10/02 |
| | | | 221/154 |
| 2011/0219706 A1 * | 9/2011 | Bates | A47B 95/008 |
| | | | 52/36.1 |
| 2011/0313937 A1 * | 12/2011 | Moore, Jr. | G06Q 30/0645 |
| | | | 705/307 |
| 2013/0084142 A1 | 4/2013 | Tong | |
| 2013/0331976 A1 | 12/2013 | Freeman | |
| 2014/0156053 A1 * | 6/2014 | Mandavi | B29C 67/0059 |
| | | | 700/119 |
| 2015/0057060 A1 * | 2/2015 | Ross | H04L 67/38 |
| | | | 463/9 |

OTHER PUBLICATIONS

"Peterson's Cylinder Re-Pinning Tools for Precision and Success Every Time", from Patents Acts 1977: Search Report under Section 17, dated Nov. 24, 2014, retrieved on Feb. 19, 2015, <http://tradelocks.co.uk/cylinder-re-pinning.htm>.

"Producing a Lock and Matching Key", GB Patent Application No. GB1409148.2, filed on May 22, 2014.

"Device Array Locks and Keys", GB Patent Application No. 1404763.3, filed on Mar. 17, 2014.

* cited by examiner

| IDENTIFIER PATTERN REPOSITORY 204 |||
|---|---|---|
| Enclosure Lock Identifer Column 204a | Key Pattern Column 204b | Lock Pattern Column 204c |
| Identifier1 | Key Pattern1 | Lock Pattern1 |
| Identifier2 | Key Pattern2 | Lock Pattern2 |
| ... | ... | ... |
| IdentifierN | Key PatternN | Lock PatternN |

| Enclosure1 | Enclosure2 | Enclosure3 | Enclosure4 |
| Enclosure5 | Enclosure6 | Enclosure7 | Enclosure8 |
| Enclosure8 | Enclosure9 | Enclosure10 | Enclosure11 |
| Enclosure12 | Enclosure13 | .... | EnclosureN |

FIG. 6

DEVICE ARRAY LOCKS AND KEYS

FIELD OF THE INVENTION

This invention relates generally to storage systems, and more particularly to storage device array locks and keys.

BACKGROUND OF THE INVENTION

Unseating an incorrect storage canister in an array of storage canisters is a common error that can be made for any one of a number of reasons. For example, the canisters and the enclosures that house the canisters can look very similar, and canisters and enclosures are getting smaller and are packed increasingly closely together. In another example, users can also be inexperienced or can be confused when reading instructions in a non-native language. In yet another example, a user may count from zero instead of one, or vice versa. Unseating the wrong canister can have particularly bad consequences when product redundancy is provided in pairs, and especially when a user unseats a good canister instead.

BRIEF SUMMARY OF THE INVENTION

In a first aspect of the invention, there is provided a system for managing a plurality of devices with associated locks, said system comprising: a sensor interface for detecting a status of a device corresponding to a lock mechanism; a management engine for recommending a service action on the device requiring performance by an operator; and a printer manager for providing a printable key pattern for printing a key that allows the operator to lock and unlock the lock mechanism in order to perform the service action.

In a second aspect of the invention, there is provided a method of managing a plurality of devices with associated locks, said method comprising: detecting, by one or more computer processors, a status of a device corresponding to a lock mechanism; recommending, by one or more computer processors, a service action on the device requiring performance by an operator; and providing, by one or more computer processors, a printable key pattern for printing a key that allows the operator to lock and unlock the lock mechanism in order to perform the service action.

In a third aspect of the invention, there is provided a method for providing a key for an attachment lock, said attachment lock being one of a plurality of attachment locks for attaching sub-units together in an assembly, said method comprising: receiving, by one or more computer processors, a key request and an attachment lock identifier for an attachment lock; retrieving, by one or more computer processors, a key pattern associated with the attachment lock identifier; and printing a key on a printer according to the key pattern associated with the attachment lock identifier.

In a fourth aspect of the invention, there is provided a computer program product for managing a plurality of devices with associated locks, the computer program product comprising a computer-readable storage medium having computer-readable program code embodied therewith, and the computer-readable program code configured to perform all operations of the methods.

In a fifth aspect of the invention, there is provided a computer program stored on a computer readable medium and loadable into the internal memory of a computer, comprising software code portions when said program is run on a computer, for performing all operations of the methods.

In a sixth aspect of the invention, there is provided a data carrier aspect of the preferred embodiment that comprises functional computer data structures to, when loaded into a computer system and operated upon thereby, enable said computer system to perform all operations of the methods. A suitable data-carrier could be a solid-state memory, magnetic drive, or optical disk. Channels for the transmission of data may likewise comprise storage media of all descriptions, as well as signal-carrying media, such as wired or wireless signal-carrying media.

BRIEF DESCRIPTION OF THE DRAWINGS

Preferred embodiments of the present invention will now be described, by way of example only, with reference to the following drawings in which:

FIG. 6 depicts an example of an array of lockable enclosures 1 to N.

DETAILED DESCRIPTION OF THE EMBODIMENTS

Figure 1:
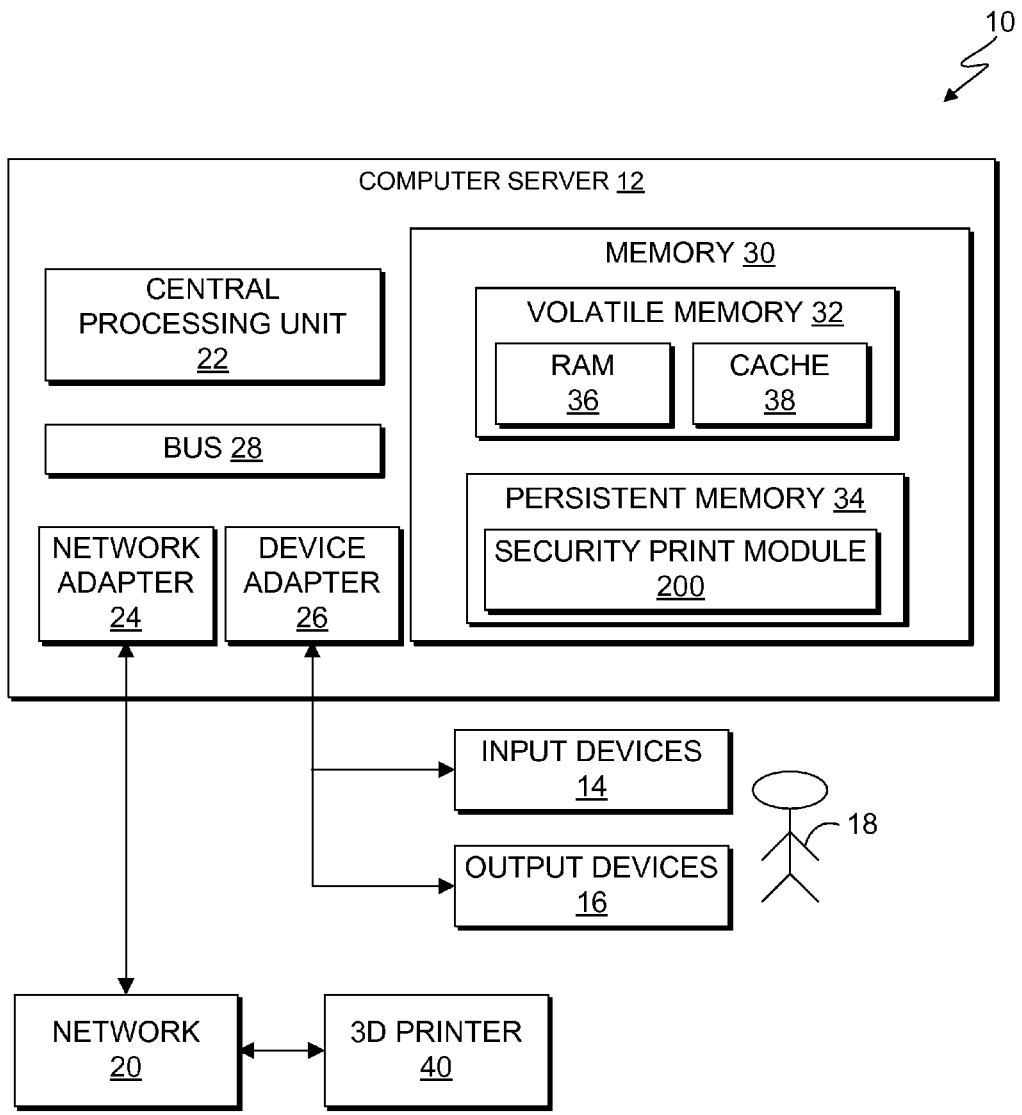
FIG. 1 is a deployment diagram of a preferred embodiment.

Referring to FIG. 1, the deployment of a preferred embodiment in computer processing system 10 is described. Computer processing system 10 is operational with numerous other general purpose or special purpose computing system environments or configurations. Examples of well-known computing processing systems, environments, and/or configurations that may be suitable for use with computer processing system 10 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer processing system 10 may be described in the general context of computer system-executable instructions, such as program modules, being executed by a computer processor. Generally, program modules may include routines, programs, objects, components, logic, and data structures that perform particular tasks or implement particular abstract data types. Computer processing system 10 may be embodied in distributed cloud computing environments where tasks are performed by remote processing devices that are linked through a communications network. In a distributed cloud computing environment, program modules may be located in both local and remote computer system storage media, including memory storage devices.

Computer processing system 10 comprises: general-purpose computer server 12, one or more input devices 14, and output devices 16 directly attached to the computer server 12. Computer processing system 10 is connected to a network 20. Computer processing system 10 communicates with a user 18 using input devices 14 and output devices 16. Input devices 14 include one or more of: a keyboard, a scanner, a mouse, trackball or another pointing device.

Output devices 16 include one or more of a display or a printer. Computer processing system 10 communicates with network devices (not shown) over network 20. Network 20 can be a local area network (LAN), a wide area network (WAN), or the Internet. Network 20 is connected to 3D printer 40.

Computer server 12 comprises: central processing unit (CPU) 22; network adapter 24; device adapter 26; bus 28 and memory 30.

CPU 22 loads machine instructions from memory 30 and performs machine operations in response to the instructions. Such machine operations include: incrementing or decrementing a value in a register; transferring a value from memory 30 to a register, or vice versa; branching to a different location in memory if a condition is true or false (also known as a conditional branch instruction); and adding or subtracting the values in two different registers and loading the result in another register. A typical CPU can perform many different machine operations. A set of machine instructions is called a machine code program; the machine instructions are written in a machine code language which is referred to as a low level language. A computer program written in a high level language needs to be compiled to a machine code program before it can be run. Alternatively, a machine code program, such as a virtual machine or an interpreter, can interpret a high level language in terms of machine operations.

Network adapter 24 is connected to bus 28 and network 20 for enabling communication between the computer server 12 and network devices, such as 3D printer 40.

Device adapter 26 is connected to bus 28 and input devices 14 and output devices 16 for enabling communication between computer server 12, input devices 14, and output devices 16.

Bus 28 couples the main system components together, including memory 30, to CPU 22. Bus 28 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Memory 30 includes computer system readable media in the form of volatile memory 32 and non-volatile or persistent memory 34. Examples of volatile memory 32 are random access memory (RAM) 36 and cache memory 38. Generally, volatile memory is used because it is faster and, generally, non-volatile memory is used because it will hold the data for longer. Computer processing system 10 may further include other removable and/or non-removable, volatile and/or non-volatile computer system storage media. By way of example only, persistent memory 34 can be provided for reading from and writing to a non-removable, non-volatile magnetic media (not shown, and typically a magnetic hard disk or solid-state drive). Although not shown, further storage media may be provided including: an external port for removable, non-volatile solid-state memory and an optical disk drive for reading from, or writing to, a removable, non-volatile optical disk such as a compact disk (CD), digital video disk (DVD), or Blu-ray. In such instances, each can be connected to bus 28 by one or more data media interfaces. As will be further depicted and described below, memory 30 may include at least one program product having a set (for example, at least one) of program modules that are configured to carry out the functions of embodiments of the invention.

The set of program modules configured to carry out the functions of the preferred embodiment comprises security print module 200. Further program modules that support the preferred embodiment, but are not shown, include firmware, boot strap program, operating system, and support applications. Each of the operating system, support applications, other program modules, and program data, or some combination thereof, may include an implementation of a networking environment.

Computer processing system 10 communicates with at least one network 20 (such as a local area network (LAN), a general wide area network (WAN), and/or a public network like the Internet) via network adapter 24. Network adapter 24 communicates with the other components of computer server 12 via bus 28. It should be understood that although not shown, other hardware and/or software components could be used in conjunction with computer processing system 10. Examples include, but are not limited to: microcode, device drivers, redundant processing units, external disk drive arrays, redundant array of independent disks (RAID), tape drives, and data archival storage systems.

Figures 2A, 2B:
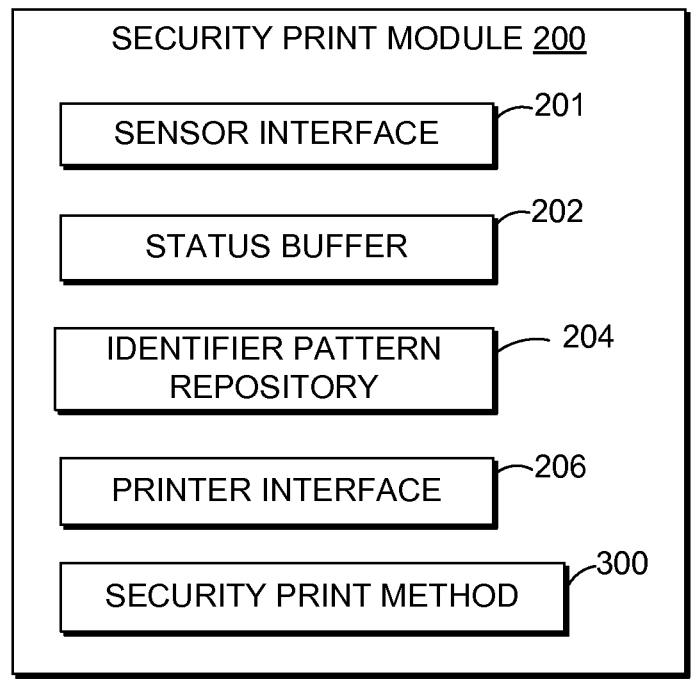
FIGS. 2A and 2B are component diagrams of the preferred embodiment.

Referring to FIG. 2A, security print module 200 comprises the following components: sensor interface 201; status buffer 202; identifier pattern repository 204; printer interface 206; and security print method 300.

Sensor interface 201 connects to a plurality of sensors in devices and/or corresponding enclosures. The sensors detect the operation status of the devices and/or the enclosures.

Status buffer 202 receives sensor status messages.

Identifier pattern repository 204 stores enclosure identifiers, associated key patterns, and lock mechanism patterns, as described in more detail below with respect to FIG. 2B.

Printer interface 206 communicates with 3D printer 40.

Security print method 300 controls computer system 10 to perform a preferred embodiment and is described in more detail with respect to FIG. 2B.

Referring to FIG. 2B, identifier pattern repository 204 comprises a data table having three columns: enclosure lock identifier column 204*a*; key pattern column 204*b*; and lock pattern column 204*c*.

Enclosure lock identifier column 204*a* comprises values that identify an enclosure lock. In the example, the identifier values are: Identifer1, Identifier2, and similar values up to IdentifierN, where N is the total number of enclosure locks.

Key pattern column 204*b* comprises key patterns that can be printed using 3D printer 40. In the example the key pattern values are: Key Pattern1, Key Pattern2, and similar values up to Key PatternN.

Lock pattern column 204*c* comprises lock mechanism patterns that can be printed using the 3D printer. In the example, the lock mechanism pattern values are: Lock Pattern1, Lock Pattern2, and similar values up to Lock PatternN.

Figure 3:
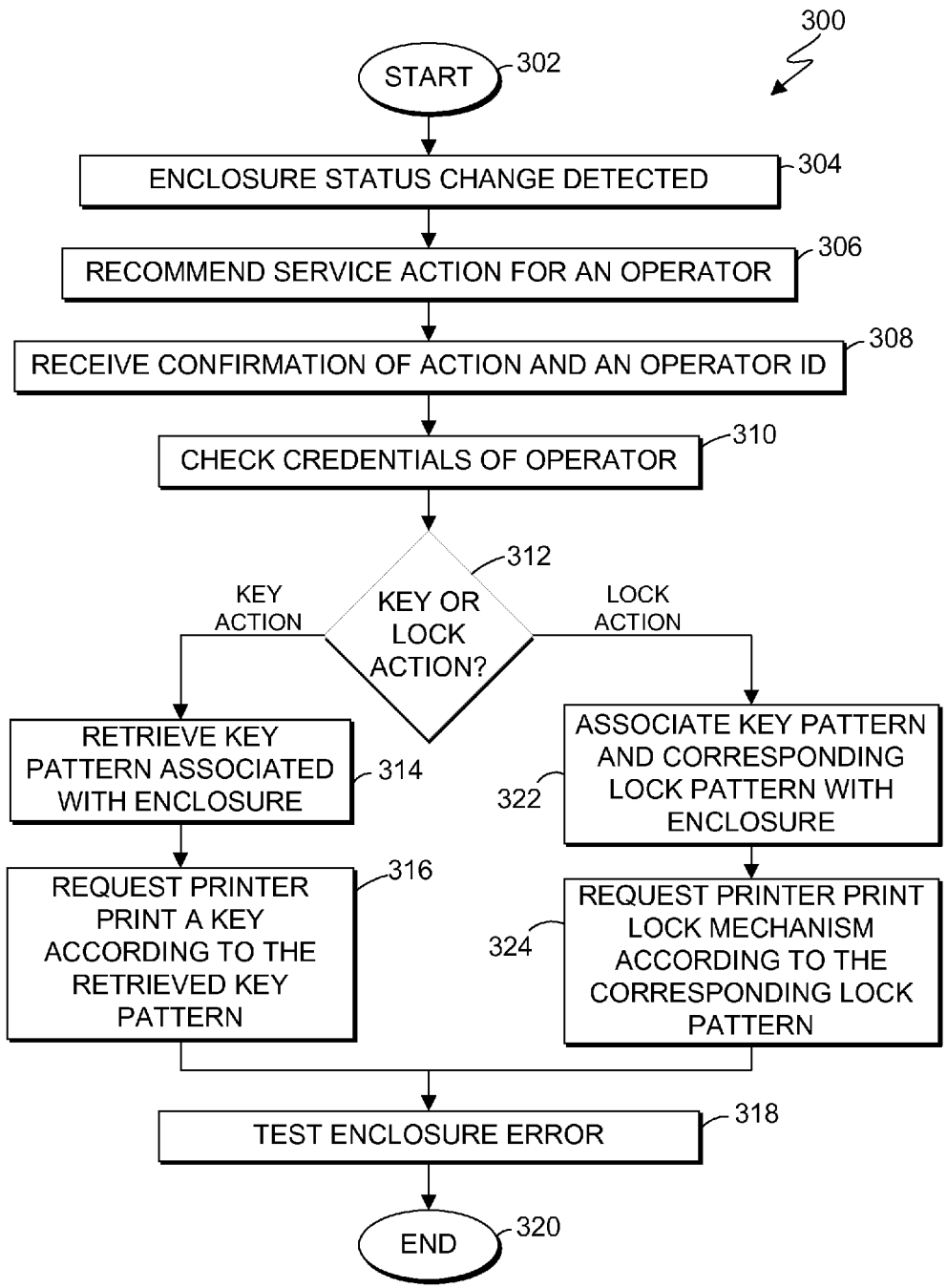
FIG. 3 is a flow diagram of a process of the preferred embodiment.

Referring to FIG. 3, security print method 300 comprises operations 302 to 324.

Security print method 300 starts at operation 302. In steady state, the method is listening for a status change on an enclosure or device.

A change is detected in an enclosure status, or in the status of a device associated with, or inside of, the enclosure (operation 304). Such a status change may be an error or failure status, whereby the device needs replacing or maintenance.

A service action is recommended to be performed on the device or enclosure (operation 306). The action may be a key action, whereby a key is required to unlock the enclosure. Another type of action is a lock action, whereby an enclosure lock is required. This may occur when an enclosure lock is required for the first time or during routine maintenance when replacing the enclosure lock.

A confirmation of action is received along with an operator identification (operation 308).

Credentials of the operator are checked (operation 310).

A check is performed to determine whether the action is a key action or a lock action (operation 312).

If the action is a key action (at operation 312), then a key pattern associated with the enclosure is retrieved (operation 314), and the 3D printer is requested to print a key according to the retrieved key pattern (operation 316). The enclosure and device are tested to see if the service action has been a success (operation 318), after which the method ends (operation 320). For instance, the service action could be "download and print this key and use it to unseat canister 1 of enclosure DPY23232XN2."

In an embodiment, each key is embodied to be a printable material of a particular shape. In an embodiment, there is a finite set of possible keys. The shape can be selected from a set of N shapes, and the serial number of the enclosure can be the identifier associated with the particular key shape.

In an embodiment, the key will only work on the associated lock so other locks will not open by mistake. Using such a method, one can use cheap, mechanical lock solutions, as well as more expensive electronic lock systems. The keys also do not have to be kept or tracked, as they can be destroyed and re-printed when needed.

In an embodiment, plastic catches/bits that allow assembly parts to be released (or their housings) can be constructed to require the insertion of a plastic dongle key that frees up their movement, and which complements them to enable their correct operation. Such parts (male and female parts) can have part numbers and can be printed from downloadable files available from procedures of the equipment. For example, a service procedure may state: 'Click on this link to download the pattern file for the releasing key for canister xxxxx. [LINK]; Print the key; Insert the key into the latch key hole of canister xxxxxx; Pull the latch of canister xxxxx to release the lock until the latch is fully open; and Slide out the canister.

Preferably, the lock needs unlocking before the service action can be performed and further comprises: retrieving the printable key pattern associated with a lock identifier and printing a key to the printable key pattern on a printer.

Preferably, the printer is a 3D printer. In another embodiment, the printer is a 2D printer, the pattern is a barcode, and the enclosure lock is a bar code reader. In yet another embodiment, the enclosure lock is a combination lock, and the printer prints the combination code.

If the action is a lock action (at operation 312), then a key pattern and corresponding lock pattern are associated with the enclosure lock identifier (operation 322), and the 3D printer is requested to print the lock mechanism according to the corresponding lock pattern (operation 324). The enclosure and device are tested to see if the service action has been a success (operation 318), after which the method ends (operation 320).

Such a service procedure can be used to print a new shape of a receiving part of the lock to replace an existing one and enable a new key. A wafer lock and warded lock are simple types of locks that could be printed, but more complex locks could also be printed.

In an embodiment, the lock is a programmable optical reader and is reprogrammed periodically with a different locking pattern and associated key.

Embodiments of the invention can manage devices that have lockable parts or devices that are locked to enclosures, where the lock is part of the device. Embodiments of the invention can also manage devices that are locked inside enclosures, where the lock is not part of the device but is still associated with it.

Embodiments of the invention can provide cheaper solutions than using physical metal keys or electronic (for example) locks, and can be designed to not require power to work. The low cost could even allow cable ends to be locked (probably in sets per machine). Contractors could move machines and be less likely to do harm by mistake, as they would only have keys which fitted the individual rack involved in the service procedure (for example). In an embodiment, the key and lock can be constructed with lower tolerances (i.e., high precision is not required), as the purpose is to prevent accidental removal.

In various embodiments, the enclosure lock and key pattern can be any one of the following locks and key types: lever tumbler lock and key, pin tumbler lock and key, wafer tumbler lock and key, barrel lock and key, a card key lock and card key, and a warded lock and key.

In an embodiment, key patterns can be retrieved that are associated with more than one lock, and a master key can be printed for the more than one lock. For example, levels of master keys can be used for different roles and locations. Further, a single key can be used for a set of associated locks (for example a socket, its machine, and its rack) so that a user can be given one key that works for everything in one rack, but not the rack next door.

Figure 4:
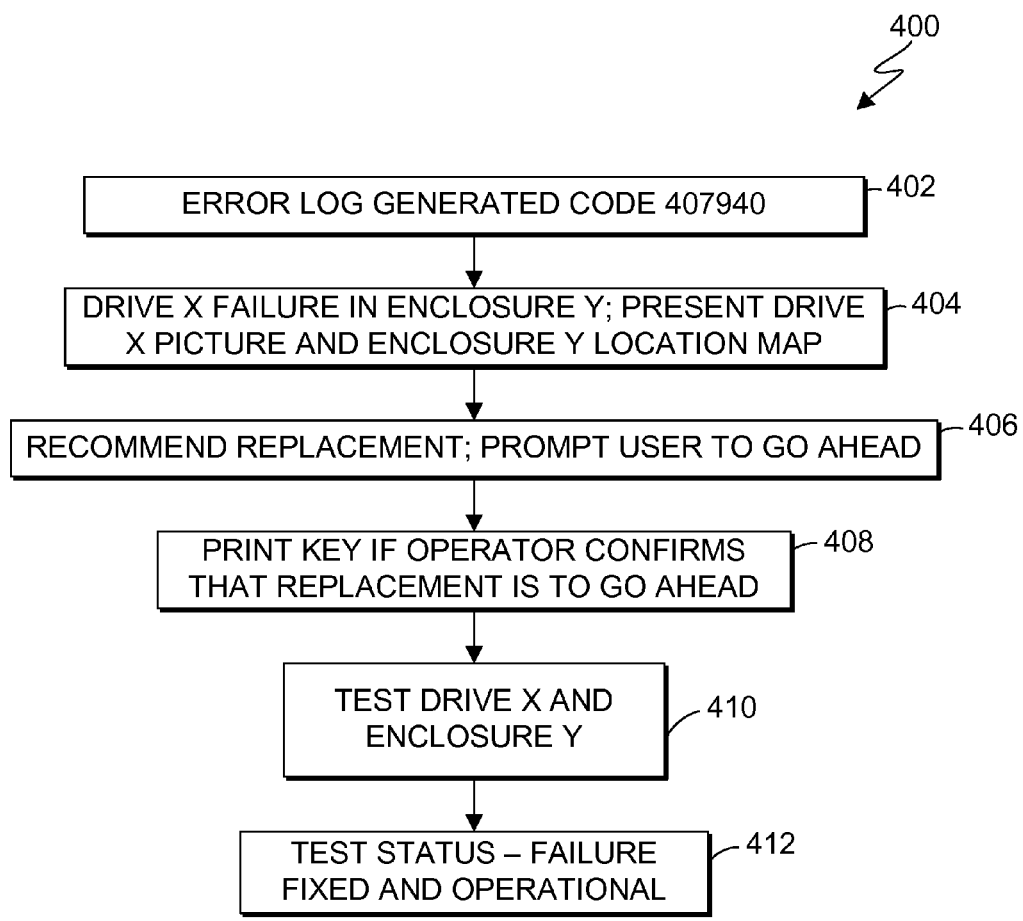
FIG. 4 is a flow diagram of an example process flow for the preferred embodiment.

Referring to FIG. 4, a security print example comprising stages 402 to 412 is described.

An error log generated code, for example 407940, referring to the status of device X, is received (stage 402).

The status of a particular drive, Drive X, in Enclosure Y is presented (stage 404). In this example, a description and picture of Drive X can be shown, along with a corresponding description and map of the location Y.

The operator is presented with a recommendation of a service action (stage 406). In this example, replacement of drive X is recommend, and the operator is prompted to respond (i.e., go ahead).

If the operator confirms that replacement is to go ahead, the key is printed (stage 408).

The replaced drive and enclosure (Drive X and Enclosure Y) are tested (stage 410).

The status of the drive is presented (stage 412). In this example, the status is "Failure fixed and operational" for the replacement drive.

Figure 5A:
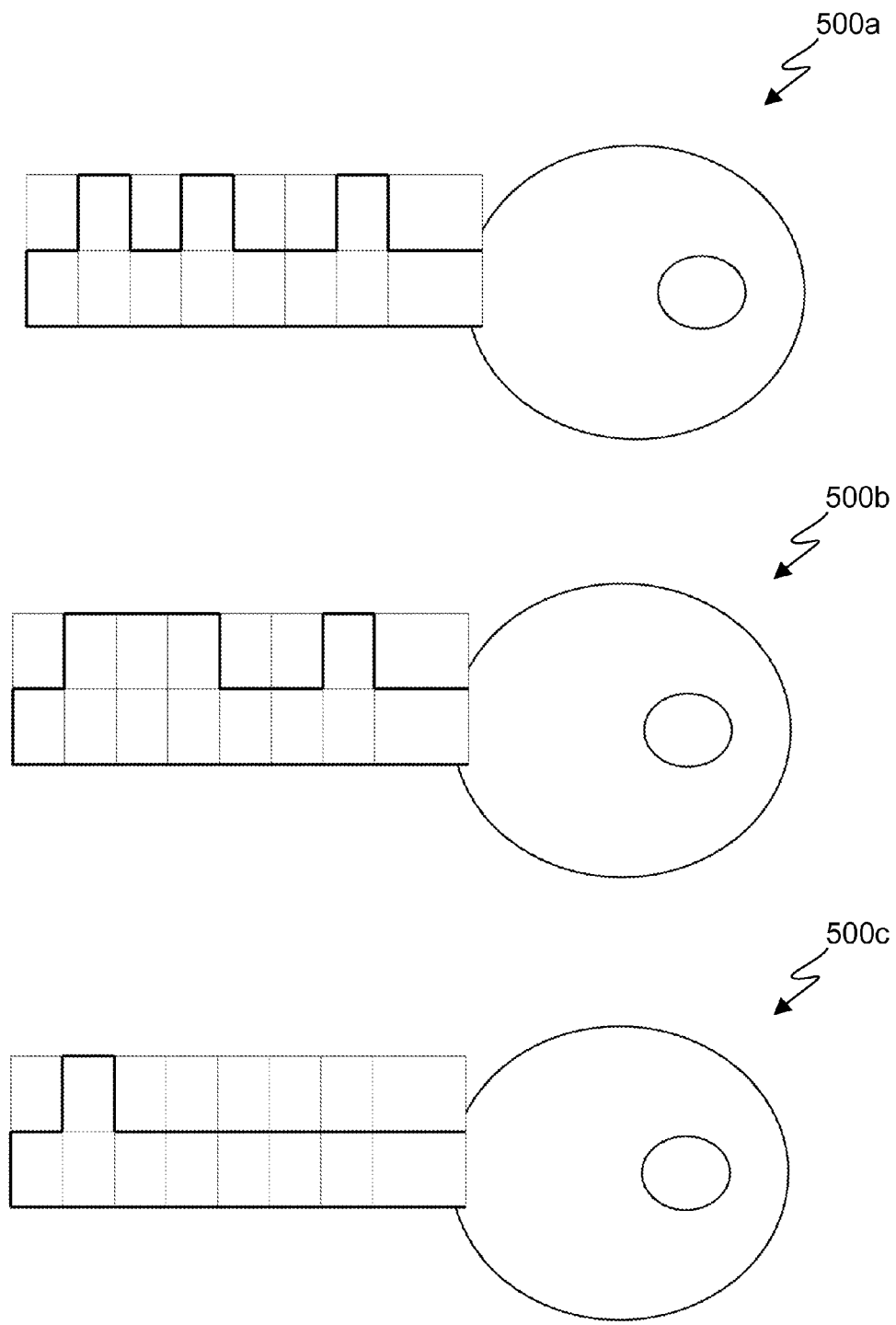
FIGS. 5A and 5B depict example key patterns.

Referring to FIG. 5A, three example key patterns 500a-c for tumbler locks are shown, for example, having traditional turning keys with teeth to engage pins in a lock mechanism. Keys can also be designed to require minimum turning forces to operate, minimizing the likelihood that a key snaps in its lock.

Figure 5B:
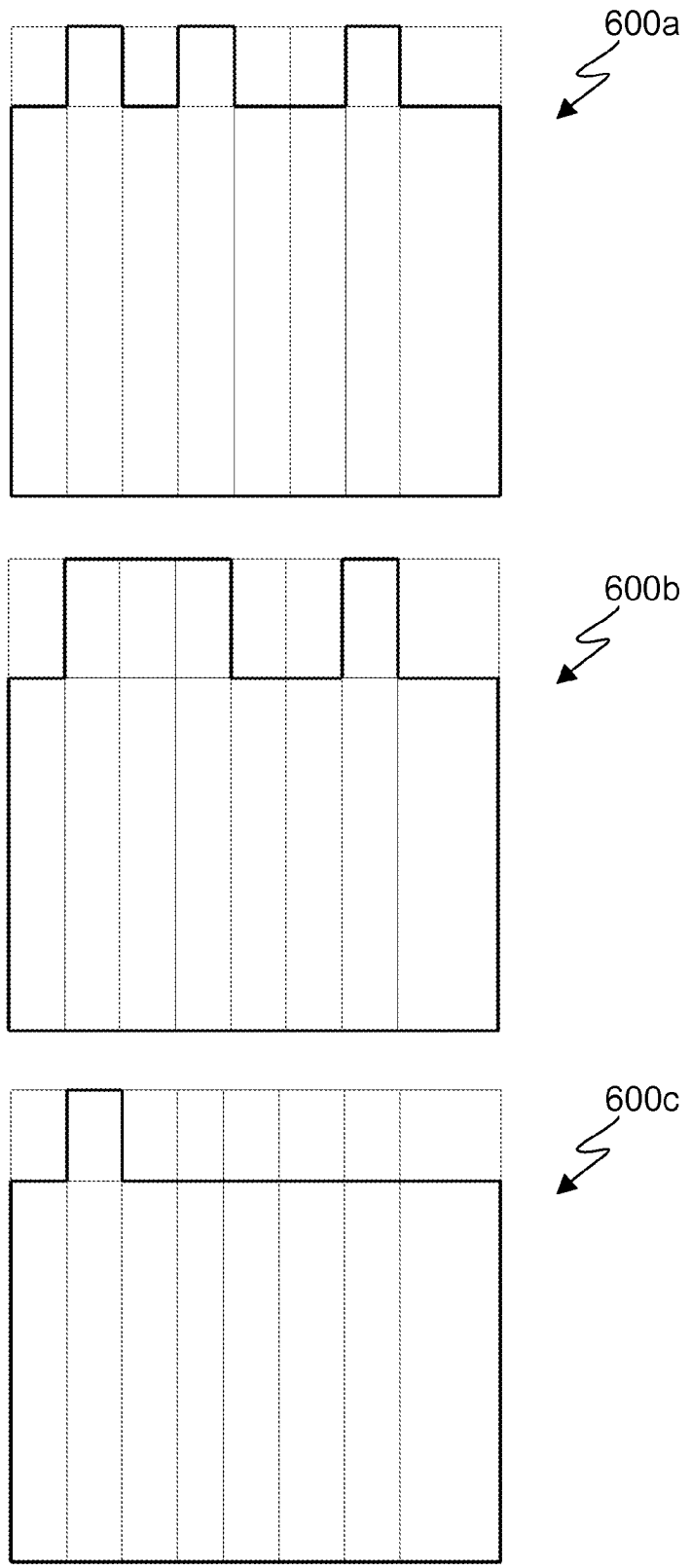

Referring to FIG. 5B, three example key patterns 600a-c for key card locks are shown, for example, having a small flat card-like key with the edge presenting the key shape to a lock situated between the metalwork of a canister and enclosure. Such shapes could also be a particularly convenient shapes for printing. Embodiments of the key/lock would not require turning forces to operate, eliminating the likelihood that a key snaps in its lock. A key that is merely pushed into a slot to disengage the lock might be favorable in this low security application.

Referring to FIG. 6, an example array of numbered enclosure doors is shown with a key hole identifying the lock mechanism.

Further embodiments of the invention are now described. It will be clear to one of ordinary skill in the art that all or part of the operations of the preferred embodiment may be alternatively embodied in a logic apparatus, or a plurality of logic apparatus, comprising logic elements arranged to perform the operations of the method, and that such logic elements may comprise hardware components, firmware components, or a combination thereof.

It will be equally clear to one of skill in the art that all or part of the logic components of the preferred embodiment may be alternatively embodied in logic apparatus comprising logic elements to perform the operations of the method, and that such logic elements may comprise components such as logic gates in, for example, a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In a further alternative embodiment, the present invention may be realized in the form of a computer implemented method of deploying a service comprising operations of deploying computer program code operable to, when deployed into a computer infrastructure and executed thereon, cause the computer system to perform all the operations of the method.

It will be appreciated that the method and components of the preferred embodiment may alternatively be embodied fully or partially in a parallel computing system comprising two or more processors for executing parallel software.

A further embodiment of the invention is a computer program product defined in terms of a system and method. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example, light pulses passing through a fibre-optic cable), or electrical signals transmitted through a wire.

Computer-readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibres, wireless transmission, routers, firewalls, switches, gateway computers and/or edge servers. A network adapter card or network interface in each computing/processing device receives computer-readable program instructions from the network and forwards the computer-readable program instructions for storage in a computer readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be clear to one skilled in the art that many improvements and modifications can be made to the foregoing exemplary embodiment without departing from the scope of the present invention.

What is claimed is:

1. A method comprising:

providing a plurality of computer components and a set of rack(s), with each computer component being constrained within the set of rack(s) by a plurality of lock mechanisms respectively associated with the plurality of computer components, and with each lock mechanism being structured to be unlocked with a different key;

receiving, by a processor(s) set, a first component unlock request including information indicating that a first computer component of the plurality of computer components is to be unlocked and removed from the set of rack(s); and responsive to the receipt of the first component unlock request, sending a first key print data set including information needed to print a first key by a three dimensional printer system, with the first key being structured to unlock a first lock mechanism of the plurality of lock mechanisms, and with the first lock mechanism being associated with the first computer component.

2. The method of claim 1 further comprising:

printing, on the three dimensional printer system and using the first key print data set, a physical instance of the first key.

3. The method of claim 2 further comprising:

unlocking the first lock mechanism using the physical instance of the first key to release the first computer component from the set of rack(s).

* * * * *